US012391877B2

(12) United States Patent
Park et al.

(10) Patent No.: US 12,391,877 B2
(45) Date of Patent: Aug. 19, 2025

(54) METHOD FOR AEROSOLIZED QUANTUM DOTS

(71) Applicants: UNIVERSITY-INDUSTRY COOPERATION GROUP OF KYUNG HEE UNIVERSITY, Yongin-si (KR); AJOU UNIVERSITY INDUSTRY-ACADEMIC COOPERATION FOUNDATION, Suwon-si (KR); Dong-eui University Industry-Academic Cooperation Foundation, Busan (KR); Kwangwoon University Industry-Academic Collaboration Foundation, Seoul (KR)

(72) Inventors: Jongwook Park, Seoul (KR); Sang Wook Kim, Seoul (KR); Jong-Min Oh, Uijeongbu-si (KR); Sung Hoon Kim, Seoul (KR); Seokwoo Kang, Hwaseong-si (KR)

(73) Assignees: UNIVERSITY-INDUSTRY COOPERATION GROUP OF KYUNG HEE UNIVERSITY, Yongin-si (KR); AJOU UNIVERSITY INDUSTRY-ACADEMIC COOPERATION FOUNDATION, Suwon-si (KR); DONG-EUI UNIVERSITY INDUSTRY-ACADEMIC COOPERATION FOUNDATION, Busan (KR); KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 441 days.

(21) Appl. No.: 17/736,237

(22) Filed: May 4, 2022

(65) Prior Publication Data

US 2023/0111894 A1 Apr. 13, 2023

(30) Foreign Application Priority Data

Oct. 7, 2021 (KR) ........................ 10-2021-0133317

(51) Int. Cl.
*C09K 11/66* (2006.01)
*B82Y 20/00* (2011.01)
(Continued)

(52) U.S. Cl.
CPC ............ *C09K 11/665* (2013.01); *C09K 11/02* (2013.01); *H10K 50/125* (2023.02); *B82Y 20/00* (2013.01); *B82Y 40/00* (2013.01)

(58) Field of Classification Search
CPC .... C09K 11/665; C09K 11/02; H10K 50/125; H10K 59/38; H10K 50/84; H10K 50/85; B82Y 20/00; B82Y 40/00
See application file for complete search history.

(56) References Cited

U.S. PATENT DOCUMENTS 11,661,526 B2 * 5/2023 Pousthomis .......... C01B 19/007 252/301.16
2008/0238294 A1 * 10/2008 Xu ......................... B82Y 30/00 257/E31.038
(Continued)

FOREIGN PATENT DOCUMENTS

CN 108102640 6/2018
KR 10-2010-0102603 9/2010
(Continued)

OTHER PUBLICATIONS

Wang, Hung-Chia, et al. "Mesoporous silica particles integrated with all-inorganic CsPbBr3 Perovskite Quantum-Dot nanocomposites (mp-pqds) with high stability and wide color gamut used for backlight display." Angewandte Chemie International Edition, vol. 55, No. 28, May 30, 2016, pp. 7924-7929. (Year: 2016).*
(Continued)

*Primary Examiner* — J.E. Schoenholtz
(74) *Attorney, Agent, or Firm* — LEX IP MEISTER, PLLC

(57) ABSTRACT

Provided are a backlight unit, a down-conversion medium including the same, and a display device including the down-conversion medium. The backlight unit includes a light source configured to generate blue light; and an optical film configured to absorb a portion of the blue light generated from the light source to generate red light and green
(Continued)

light, wherein the optical film includes a quantum dot matrix in which semi-metal element oxide is embedded.

2 Claims, 16 Drawing Sheets

(51) Int. Cl.
*B82Y 40/00* (2011.01)
*C09K 11/02* (2006.01)
*H10K 50/125* (2023.01)

(56) References Cited

U.S. PATENT DOCUMENTS

| | | | |
|---|---|---|---|
| 2017/0358745 A1* | 12/2017 | Juang | H01L 33/145 |
| 2018/0138359 A1* | 5/2018 | Ulmer | H01L 33/06 |
| 2021/0202765 A1 | 7/2021 | Cho et al. | |
| 2022/0306935 A1* | 9/2022 | Pousthomis | C09K 11/565 |
| 2024/0263069 A1* | 8/2024 | Mamuye | C08J 5/18 |

FOREIGN PATENT DOCUMENTS

| | | |
|---|---|---|
| KR | 10-0981309 | 9/2010 |
| KR | 10-2018-0018066 | 2/2018 |
| KR | 10-2018-0059724 | 6/2018 |
| KR | 10-2020-0077201 | 6/2020 |
| KR | 10-2138074 | 7/2020 |
| KR | 10-2021-0077708 | 6/2021 |

OTHER PUBLICATIONS

Singh, Rajan Kumar, et al. "Progress of backlight devices: Emergence of halide perovskite quantum dots/nanomaterials." Frontiers in Nanotechnology, vol. 4, Jun. 21, 2022, https://doi.org/10.3389/fnano.2022.863312. (Year: 2022).*

Reda, S.M. "Synthesis and optical properties of cds quantum dots embedded in silica matrix thin films and their applications as luminescent solar concentrators." Acta Materialia, vol. 56, No. 2, Jan. 2008, pp. 259-264, https://doi.org/10.1016/j.actamat.2007.09.017. (Year: 2008).*

Xing, Mingyang, et al. "Confined growth of quantum dots in silica spheres by ion exchange of 'Trapped nh4+' for white-light emission." Chem, vol. 5, No. 8, Aug. 2019, pp. 2195-2214, https://doi.org/10.1016/j.chempr.2019.06.010. (Year: 2019).*

Semi-metals or Metalloids, Elements with Properties of Both Metals and Nonmetals, A. Helmenstine, Jul. 17, 2019 downloaded from URL<https://www.thoughtco.com/semimetals-or-metalloids-list-606662> on Dec. 26, 2024. (Year: 2019).*

Definition of 'Embed' downloaded from URL<https://www.merriam-webster.com/dictionary/embed> on Jan. 6, 2025. (Year: 2025).*

Kim, Sunghoon, et al. "Highly thin film with aerosol-deposited perovskite quantum dot/metal oxide composite for perfect color conversion and luminance enhancement." Chemical Engineering Journal, vol. 441, Aug. 2022, p. 135991, https://doi.org/10.1016/j.cej.2022.135991. (Year: 2022).*

Hung-Chia Wang et al., "Mesoporous Silica Particles Integrated with All-Inorganic CsPbBr3 Perovskite Quantum-Dot Nanocomposites (MP-PQDs) with High Stability and Wide Color Gamut Used for Backlight Display", Agnew. Chem. Int. Ed. 2016, 55, 7924-7929, Jul, 4, 2016.

* cited by examiner

CsPbBr₃ (green)

CsPb(BrI)₃ (red)

METHOD FOR AEROSOLIZED QUANTUM DOTS

CROSS-REFERENCE TO RELATED APPLICATION

This application claims priority to and the benefit of Korean Patent Application No. 10-2021-0133317 filed in the Korean Intellectual Property Office on Oct. 7, 2021, the entire contents of which are incorporated herein by reference.

BACKGROUND OF THE INVENTION

(a) Field of the Invention

The present disclosure relates to a backlight unit including aerosolized quantum dots, a down-conversion medium including the same, and a display device including the down-conversion medium.

(b) Description of the Related Art

Recently, a material in which perovskite nanocrystals are encapsulated with various polymer materials such as polystyrene, polymethylmethacrylate, and the like has been proved to be applied as a light-emitting material in commercial LED devices, and currently, research on applying this material to a down-conversion medium (DCM) is being actively conducted. However, the down-conversion medium must use a color filter in a prior art, but there is a problem of hardly improving photo efficiency due to the use of the color filter.

In addition, the light-emitting material uses an insulation polymer as a matrix, wherein the insulation polymer still has a problem of being inherently vulnerable to thermal stress. In particular, long-term thermal stress may cause softening deformation or damage to thermoplastic polymers such as polystyrene, polymethylmethacrylate, a cycloolefin copolymer, and the like.

SUMMARY OF THE INVENTION

An embodiment provides a backlight unit capable of improving pattern processibility and photo efficiency.

Another embodiment provides a down-conversion medium including the backlight unit.

Another embodiment provides a display device including the down-conversion medium.

An embodiment of the present invention provides a backlight unit including a light source configured to generate blue light, and an optical film configured to absorb a portion of the blue light generated from the light source to generate red light and green light, wherein the optical film includes a quantum dot matrix in which a semi-metal element oxide is embedded.

The semi-metal element may include boron, silicon, germanium, arsenic, antimony, tellurium, fluorine, or a combination thereof.

The semi-metal element oxide may be silica.

The quantum dot may include Group 2-6 quantum dots, Group 3-5 quantum dots, Group 4-6 quantum dots, Group 4 quantum dots, Group 1-3-6 quantum dots, or a combination thereof.

The quantum dots may be Group 3-5 quantum dots.

The quantum dost may have a perovskite crystal structure.

The quantum dots may be metal halide-based quantum dots having a perovskite crystal structure.

The metal halide-based quantum dots having the perovskite crystal structure may be represented by Chemical Formula 1.

$$ABX_3 \qquad \text{[Chemical Formula 1]}$$

In Chemical Formula 1,

A is an organic cation or inorganic cation,

B is a metal cation, and

X is a halide anion.

Chemical Formula 1 may be represented by $CsPbX'_3$, wherein X' is Cl, Br, and/or I.

The metal halide-based quantum dost having the perovskite crystal structure may be green quantum dots or red quantum dots.

The green quantum dots may be $CsPbBr_3$ and the red quantum dots may be $CsPb(BrI)_3$.

The quantum dot matrix in which the semi-metal element oxide is embedded may be aerosolized.

The aerosolization may be carried out under vacuum conditions.

An aerosol flow rate during the aerosolization may be about 0.1 L/min to about 10 L/min.

The light source configured to generate blue light may be a blue OLED, a blue LED, or a blue EL device.

Another embodiment provides a down-conversion medium including the backlight unit.

The down-conversion medium may be a color filter-free down-conversion medium.

Another embodiment provides a display device including the down-conversion medium.

Other embodiments of the present invention are included in the following detailed description.

The backlight unit according to one embodiment may greatly improves photo efficiency of the down-conversion medium without a color filter and thus ultimately improve photo efficiency of in a display device including the same by completely blocking a blue light leakage phenomenon, and furthermore, since a thin line width is realized, a pattern process may be performed without a mask.

BRIEF DESCRIPTION OF THE DRAWINGS

FIG. 1 is a schematic view illustrating a process of manufacturing a backlight unit according to an embodiment.

FIG. 2 is a microscopic photograph of a backlight unit in which silica-embedded green quantum dots ($CsPbBr_3$) are aerosolized and deposited on a blue OLED.

FIG. 3 is a photomicrograph of a backlight unit in which silica-embedded red quantum dots ($CsPb(BrI)_3$) are aerosolized and deposited on a blue OLED.

FIG. 4 is a microscopic photograph of green quantum dots ($CsPbBr_3$) aerosolized and deposited on a blue OLED.

FIG. 5 is a microscopic photograph of alumina-embedded green quantum dots ($CsPbBr_3$) which are aerosolized and deposited on a blue OLED.

FIG. 6 is a microscopic photograph of silica-embedded green quantum dots ($CsPbBr_3$) which are aerosolized and deposited on a blue OLED.

FIG. 7 is a microscopic photograph of red quantum dots ($CsPb(BrI)_3$) which are aerosolized and deposited on a blue OLED.

FIG. 8 is a microscopic photograph of alumina-embedded red quantum dots ($CsPb(BrI)_3$) which are aerosolized and deposited on a blue OLED.

Figure 9:
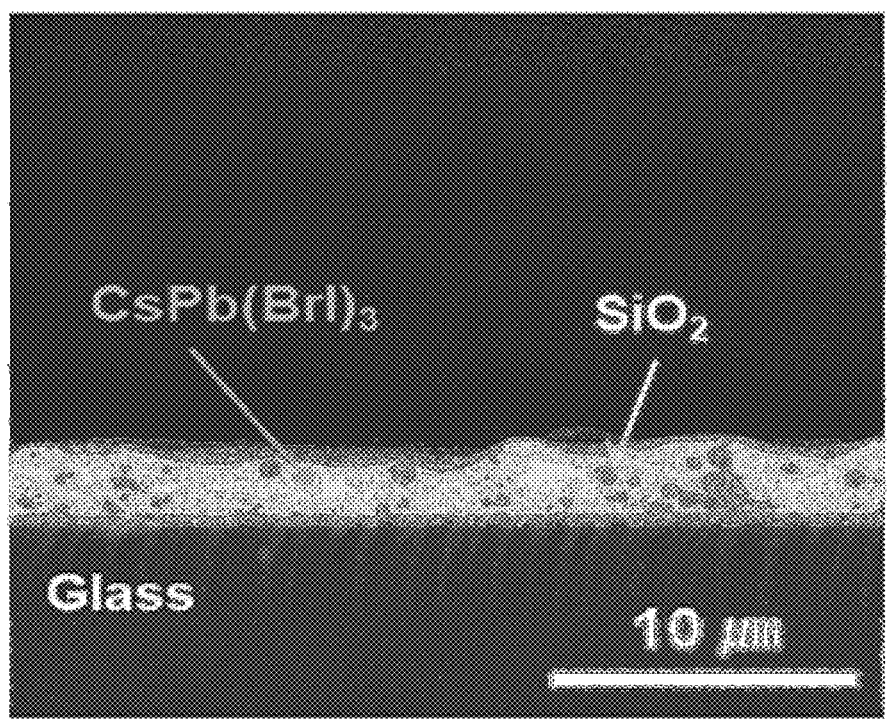

FIG. 9 is a microscopic photograph of silica-embedded red quantum dots (CsPb(BrI)$_3$) which are aerosolized and deposited on a blue OLED.

FIGS. 10 and 11 are graphs each independently showing the photo efficiency of the backlight unit according to Example 1, Comparative Example 1, and Comparative Example 2.

FIGS. 12 and 13 are graphs each independently showing the luminance of the backlight units according to Example 1, Comparative Example 1, and Comparative Example 2.

FIG. 14 is a graph showing the luminance (green) of the backlight unit according to Example 2.

FIG. 15 is a graph showing the luminance (green) of the backlight unit according to Example 1.

FIG. 16 is a graph showing the luminance (green) of the backlight unit according to Example 3.

DETAILED DESCRIPTION OF THE EMBODIMENTS

Hereinafter, embodiments of the present invention are described in detail. However, these embodiments are exemplary, the present invention is not limited thereto, and the present invention is defined by the scope of claims.

As used herein, when specific definition is not otherwise provided, "substituted" refers to one substituted with a substituent selected from a halogen (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are the same or different, and are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group and a substituted or unsubstituted heterocyclic group.

As used herein, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically 01 to C18 alkylene group, and "arylene group" refers to a C6 to C20 arylene group, and specifically a C6 to C16 arylene group.

As used herein, when specific definition is not otherwise provided, "(meth)acrylate" refers to "acrylate" and "methacrylate," and "(meth)acrylic acid" refers to "acrylic acid" and "methacrylic acid."

As used herein, when specific definition is not otherwise provided, "combination" refers to mixing or copolymerization. In addition, "copolymerization" refers to block copolymerization or random copolymerization, and "copolymer" refers to a block copolymer or a random copolymer.

In the chemical formula of the present specification, unless a specific definition is otherwise provided, hydrogen is boned at the position when a chemical bond is not drawn where supposed to be given.

In the present specification, when specific definition is not otherwise provided, "*" indicates a point where the same or a different atom or chemical formula is linked.

An embodiment provides a backlight unit including a light source configured to generate blue light; and an optical film configured to absorb a portion of the blue light generated from the light source to generate red light and green light, wherein the optical film includes quantum dots in which the semi-metal element oxide is embedded.

A conventional deposition method may be currently adopted to realize a large area display but suffer from problems such as a process yield, mask warpage, and uniformity, and in order to solve the problems, an inkjet printing method is being discussed. Currently, the inkjet printing method is adopted to coat quantum dots on a blue OLED substrate but suffers from problems such as nozzle clogging, non-uniform drying, difficulty in implementing a bank height, thickness increase of a color conversion layer, a light leakage phenomenon, and the like.

Since these problems are caused by the color filter used in the down-conversion medium (DCM), the inventors of the present invention have repeated numerous experiments and trial and error in order to make the down-conversion medium usable without the color filter and solved the problems by coating nanocrystals in which the semi-metal element oxide is embedded, for example, quantum dots on a light source configured to generate blue light, for example, a blue OLED substrate.

There have been prior attempts to use quantum dots in which an oxide is embedded, but no attempts to embed a semi-metal element oxide in quantum dots.

For example, the semi-metal element may include boron, silicon, germanium, arsenic, antimony, tellurium, fluorine, or a combination thereof. For example, the semi-metal element may be silicon.

For example, the semi-metal element oxide may be silica.

When the oxides embedded in quantum dots are not semi-metal oxides but metal oxides, compared with the semi-metal oxides, luminance of a finally-manufactured backlight unit is lower, thus it is an insignificant effect of improving photo efficiency.

For example, the quantum dots may include Group 2-6 quantum dots such as CdSe, CdS, CdTe, ZnSe, ZnS, or ZnTe, Group 3-5 quantum dots such as InP or InAs, Group 4-6 quantum dots such as PbS, PbSe, PbTe, Group 4 quantum dots such as Ge or Si, Groups 1-3-6 quantum dots such as $Cu_{1-x}In_xS_{1-y}Se_y$ (0<x and y<1), or a combination thereof, but are not necessarily limited thereto.

For example, the quantum dot may have a core-shell structure, wherein the core may be formed of Group 2-6 quantum dots, Group 3-5 quantum dots, Group 4-6 quantum dots, Group 4 quantum dots, a Group 1-3-6 quantum dots, or a combination thereof, and the like, and the shell may be a single shell, a double shell, or a triple shell.

Recently, since worldwide interest in the environment has been greatly increased, while regulations on toxic substances are being strengthened, environmentally-friendly cadmium-free quantum dots (InP/ZnS, InP/ZeSe/ZnS, and the like) may be used instead of quantum dots having a cadmium-based core, and for example, when environmentally-friendly cadmium-free quantum dots have a core-shell structure, Groups 3 to 5 quantum dots may be used as the core but are not necessarily limited thereto.

For example, the quantum dots may have a perovskite crystal structure.

For example, the quantum dots may be a metal halide-based quantum dot having a perovskite crystal structure. In this case, the quantum dots having the perovskite crystal structure may control the bandgap by the metal halide element. The bandgap energy of the quantum dots may be about 1 eV to about 5 eV.

For example, the metal halide-based quantum dots having the perovskite crystal structure may be represented by Chemical Formula 1, but are not necessarily limited thereto.

$$ABX_3 \quad \text{[Chemical Formula 1]}$$

In Chemical Formula 1,
A is an organic cation or an inorganic cation,
B is a metal cation, and
X is a halide anion.

For example, Chemical Formula 1 may be represented by $CsPbX'_3$, wherein X' is Cl, Br, and/or I.

For example, the metal halide-based quantum dots having a perovskite crystal structure may be green quantum dots having an average particle diameter of 1 nm to 8 nm or red quantum dots having an average particle diameter of 9 nm to 15 nm. In this case, the green quantum dots may be represented by $CsPbBr_3$, and the red quantum dots may be represented by $CsPb(BrI)_3$.

For example, a size of the metal halide-based quantum dots having the perovskite crystal structure may be about 1 nm to about 900 nm. When the metal halide-based quantum dots having the perovskite crystal structure have a size of greater than about 900 nm, there may be a fundamental problem that excitons may not reach light emission but may be separated into free charges and then disappear due to thermal ionization and delocalization of charge carriers inside large nanocrystals.

For example, the quantum dots in which the semi-metal element oxide is embedded may be aerosolized. In other words, the quantum dots in which the semi-metal element oxide is embedded may be aerosolized and coated on the light source configured to generate blue light. Herein, compared with when the quantum dots are coated without aerosolization, there may be effects of shortening process time, reducing a thickness of a color conversion layer, improving photo efficiency, and the like. In addition, when the quantum dots are aerosolized and coated on the blue OLED substrate, the blue light leakage phenomenon may be completely blocked at a thickness of about 7 μm. Furthermore, when the quantum dots in which the semi-metal element oxide are embedded are aerosolized and coated, the blue light leakage phenomenon may be completely blocked at a thinner thickness, for example, at about 3 μm, and in addition, the photo efficiency may be improved by about 40% or more, compared with when the semi-metal element oxide is coated without being embedded.

For example, the aerosolization may be carried out under vacuum conditions.

In an example embodiment, the quantum dots in which the semi-metal element oxide are embedded may be prepared by mixing a precursor material of quantum dots and a semi-metal element oxide powder in a solvent, growing nanocrystals on the surface of the semi-metal element oxide powder, and pulverizing them. In another example embodiment, the pre-synthesized quantum dots are mixed with the semi-metal element oxide powder in the solvent, and the solvent is evaporated to adsorb or bond the nanocrystals onto the surface of the semi-metal element oxide powder and pulverizing them.

Herein, the precursor material of the quantum dots or the semi-metal element oxide powder mixed with the quantum dots may have a larger size than the quantum dots. For example, the semi-metal element oxide powder may have a size of greater than or equal to about 300 nm and less than or equal to about 2000 nm. On the other hand, when the quantum dots are mixed with the semi-metal element oxide powder, the quantum dots may be mixed in an amount of about 0.5 parts by weight to about 20 parts by weight based on about 100 parts by weight of the semi-metal element oxide powder.

The process of coating by aerosolization of the quantum dots in which the semi-metal element oxide is embedded may be performed using an aerosol deposition apparatus.

Figure 1:
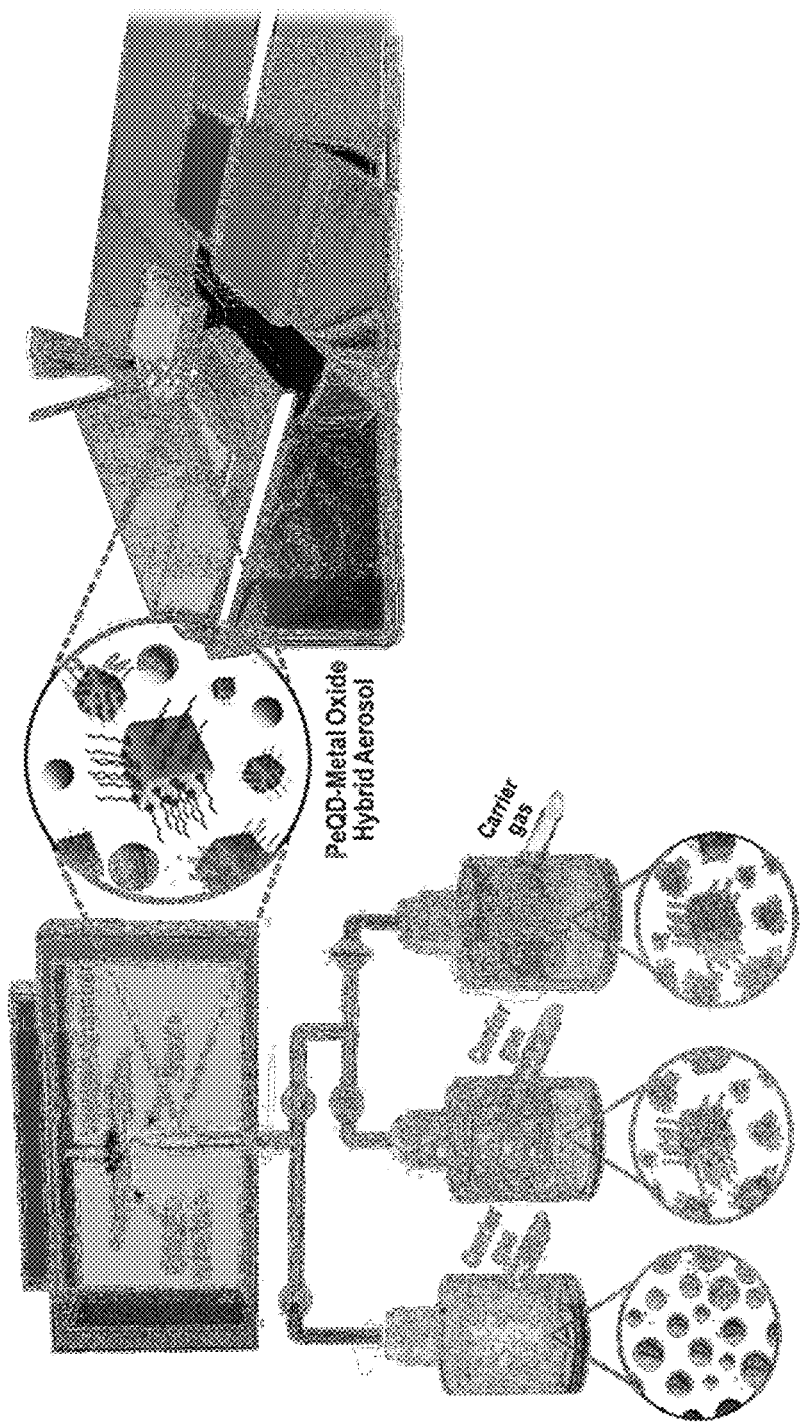

As shown in FIG. 1, an aerosol deposition device may include an aerosol chamber (not shown), a deposition vacuum chamber, a carrier gas supply means, a vacuum pump (not shown), and a nozzle. The aerosol chamber may accommodate the quantum dots and the semi-metal element oxide powder, and the light source configured to generate blue light, for example, the blue OLED substrate may be disposed in the deposit chamber. The carrier gas supply means may supply carrier gas to the aerosol chamber, and the vacuum pump may make the deposition chamber in a vacuum state. The nozzle may be disposed to be spaced apart from the substrate in the deposition chamber and connected to the aerosol chamber through a connection pipe. On the other hand, the aerosol chamber may be equipped with a vibrator so that the nozzle may spray the composite powder in a uniform aerosol form.

The aerosol deposition process makes the quantum dots and semi-metal element oxide powder accommodated in the aerosol chamber, and when the carrier gas is injected through the carrier gas supply means into the aerosol chamber, while the blue OLED substrate is disposed in the deposition chamber, the quantum dots and the semi-metal element oxide powders may be sprayed in an aerosol form through the nozzle onto the blue OLED substrate due to a pressure difference between the deposition chamber in a vacuum state and the aerosol chamber and thus form a thin film formed of the quantum dots in which the semi-metal element oxide is embedded on the blue OLED substrate.

In an embodiment, nitrogen ($N_2$) may be used as carrier gas of the aerosol deposition process.

Helium (He) is in general used as the carrier gas of the aerosol deposition process. However, since helium has a small molecular weight, when helium gas is used as the carrier gas, the quantum dots and the semi-metal element oxide powders collide with the substrate and other powders at a relatively high speed during the aerosol deposition process. In this way, when the quantum dots and the semi-metal element oxide powders collide with the substrate or the other powders at a relatively high speed by the helium gas and thus receive high impact forces, the helium gas forms an electrically discharged plasma, and this plasma may cause serious damage to the quantum dots and the semi-metal element oxide powder, particularly, the quantum dots. In an actual aerosol deposition process, when the helium gas is used as the carrier gas to spray the $CsPbBr_3$—$SiO_2$ composite powder onto a substrate, strong light emission in local areas is observed, light emitted from a thin film formed through the aerosol deposition process has a blue-shifted wavelength compared with light generated from the composite powder itself, resulting in lowering luminance intensity.

However, when nitrogen ($N_2$) is used as the carrier gas of the aerosol deposition process as in the present invention, the nitrogen may not form the discharge plasma but solves the problems of damaging the quantum dots and the semi-metal element oxide powder, which are generated by using the helium gas as the carrier gas.

Since the aerosol deposition process is performed in the form of high-speed jetting oxide powder particles with a size of about 1 μm, various factors such as types of carrier gas, particle shape, flow rate conditions of the carrier gas, nozzle design, and the like may cause deterioration, but since the quantum dots applied in one embodiment have a very small size (about 1 nm to about 15 nm), kinetic energy is not high enough to damage the quantum dots, thereby not causing the degradation, but the high-speed jet method may be used to form a fairly dense film without pinholes, defects, and the like therein and contribute to greatly reducing a thickness of the film.

On the other hand, an aerosol gas flow rate of the aerosolized quantum dots in which the semi-metal element oxide is embedded according to an example embodiment of the present invention may be controlled to about 0.1 L/min to about 10 L/min, for example, about 0.1 L/min to about 1.0 L/min, for example, about 0.1 L/min to about 0.5 L/min, or for example, about 0.2 L/min to about 0.4 L/min. When the aerosol flow rate is controlled as above, an amount of impacts applied to the quantum dots and the semi-metal element oxide powder may be sufficiently reduced, so that the luminance intensity may not be lowered, and in addition, mechanical characteristics or optical properties of the thin film may be not deteriorated. In particular, when the aerosol gas flow rate is controlled as described above, luminescence characteristics among optical properties may be greatly improved. In addition, when the gas flow rate during the aerosolization is adjusted as described above, a very thin line width may be realized, so that a pattern process may be performed without a mask.

The quantum dots in which the semi-metal element oxide is embedded may have a structure in which the quantum dots are uniformly dispersed in a semi-metal element oxide matrix, and may have a thickness of about 1 μm to about 50 μm.

For example, the light source configured to generate blue light may be a blue OLED, a blue LED, a blue EL device, and the like, but is not necessarily limited thereto. For example, the light source configured to generate blue light may be a direct light source unit including a diffusion plate and blue OLEDs disposed under the diffusion plate or an edge-type light source unit including a light guide plate and blue OLEDs disposed on the side surface of the light guide plate.

The optical film is disposed on top of the light source configured to generate blue light and may absorb a portion of the blue light, and then convert it into red light and green light.

For example, the optical film may include a first light conversion layer and a second light conversion layer.

The first light conversion layer may absorb the blue light from the light source and then convert it into the red light. In an embodiment, the first light conversion layer may have a structure in which red quantum dots are dispersed in a first semi-metal element oxide matrix. The first semi-metal element oxide matrix may be formed of silica. The red quantum dots may be metal halide-based quantum dots having the perovskite crystal structure.

The second light conversion layer is formed on the first light conversion layer and may absorb blue light from the light source and then convert it into green light. In an embodiment, the second light conversion layer may have a structure that green quantum dots are dispersed in a second semi-metal element oxide matrix. The second semi-metal element oxide matrix may also be formed of silica. The green quantum dots may be metal halide-based quantum dots having the perovskite crystal structure.

In an embodiment, the optical film 120 may be formed by sequentially forming the first light conversion layer 122 and the second light conversion layer 123 on the substrate 121 through the aerosol deposition method.

The first light conversion layer may be formed on the light source by preparing first composite powder of the red quantum dots and the first semi-metal element oxide, and then controlling the aerosol gas flow rate thereof in the aerosol deposit method using nitrogen as the carrier gas.

The second light conversion layer may be formed on the light source by preparing the second composite powder of the green quantum dots and the second semi-metal element oxide and then controlling the aerosol gas flow rate thereof in the aerosol deposit method using nitrogen as the carrier gas.

Since an optical film applied to a backlight unit according to the present invention has a structure of including quantum dots dispersed in a semi-metal element oxide matrix, particularly, metal halide-based quantum dots having a perovskite crystal structure, excellent long-term stability against external heat, moisture, and stress may be obtained, and since being formed by controlling an aerosol gas flow rate, a fine pattern process may not only be performed without a mask, but excellent mechanical and optical properties may also be obtained.

Another embodiment provides a down-conversion medium including the backlight unit.

The down-conversion medium may be a color filter-free down-conversion medium, that is, a down-conversion medium that does not include a color filter.

Another embodiment provides a display device including the down-conversion medium.

Hereinafter, the present disclosure is illustrated in more detail with reference to examples, but these examples are not in any sense to be interpreted as limiting the scope of the disclosure.

MANUFACTURE OF BACKLIGHT UNIT

Example 1

A mechanical rotary pump was used to create an almost complete vacuum in a chamber, and cadmium-free perovskite quantum dots (PeQD) film were deposited by using a UAD at room temperature (25° C.) under a pressure of $10^{-1}$ torr. After mixing TOPO-Zn $CsPbBr_3$ (green) and TOPO-Zn $CsPb(BrI)_3$ (red) quantum dots as light conversion layer materials in n-hexane respectively at a concentration of 64 mg per 100 ml, silica powder was infiltrated through a fine sieve (ASTM mesh No. 170). The prepared green and red materials were respectively disposed in different aerosol chambers. An ultrasonic nebulizer (1.8 MHz) and a $N_2$ carrier gas injected at a rate of 1 L/min were used to generate aerosolized droplets of the PeQD solution, starting to deposit clean PeQD (green or red). As for a system containing a mixture of PeQD and semi-metal element oxide of silica, two constituent elements were allowed to converge into a nozzle from each aerosol chamber for the subsequent codeposition. In order to control a feed rate of PeQD and the silica, a mass flow rate controller was adjusted to control a flow rate of aerosol gas to 0.3 L/min by using the $N_2$ carrier gas, and the ultrasonically-generated PeQD aerosol was made to quickly pass through an orifice nozzle (with a diameter of 1 mm) due to a pressure difference between the aerosol and the deposition chamber under the carrier gas flow. This aerosol was rapidly sprayed onto a BOLED substrate 5 mm away from the nozzle. Subsequently, a substrate holder attached to the BOLED substrate was automatically moved along an XY plane at a scan speed of 5 mm/s. As a result, a PeQD layer or a PeQD-silica composite layer was densely deposited on the BOLED substrate. A film thickness of the layer was changed by adjusting a concentration of PeQD and the number of scans. In order to block blue light, a light conversion layer was deposited at the PeQD (green and red) concentration of 64 mg/100 ml and 3 to 4 scans.

Example 2

A cadmium-free perovskite quantum dot (PeQD) film was deposited in the same manner as in Example 1, except that the flow rate of aerosol gas was changed to 0.1 L/min instead of 0.3 L/min.

Example 3

A cadmium-free perovskite quantum dot (PeQD) film was deposited in the same manner as in Example 1, except that the flow rate of aerosol gas was changed to 0.5 L/min instead of 0.3 L/min.

Comparative Example 1

A cadmium-free perovskite quantum dot (PeQD) film was deposited in the same manner as in Example 1, except that the silica powder was not used.

Comparative Example 2

A cadmium-free perovskite quantum dot (PeQD) film was deposited in the same manner as in Example 1, except that alumina ($\alpha$-$Al_2O_3$) was used instead of the silica powder.
<Evaluation>

Figure 2:
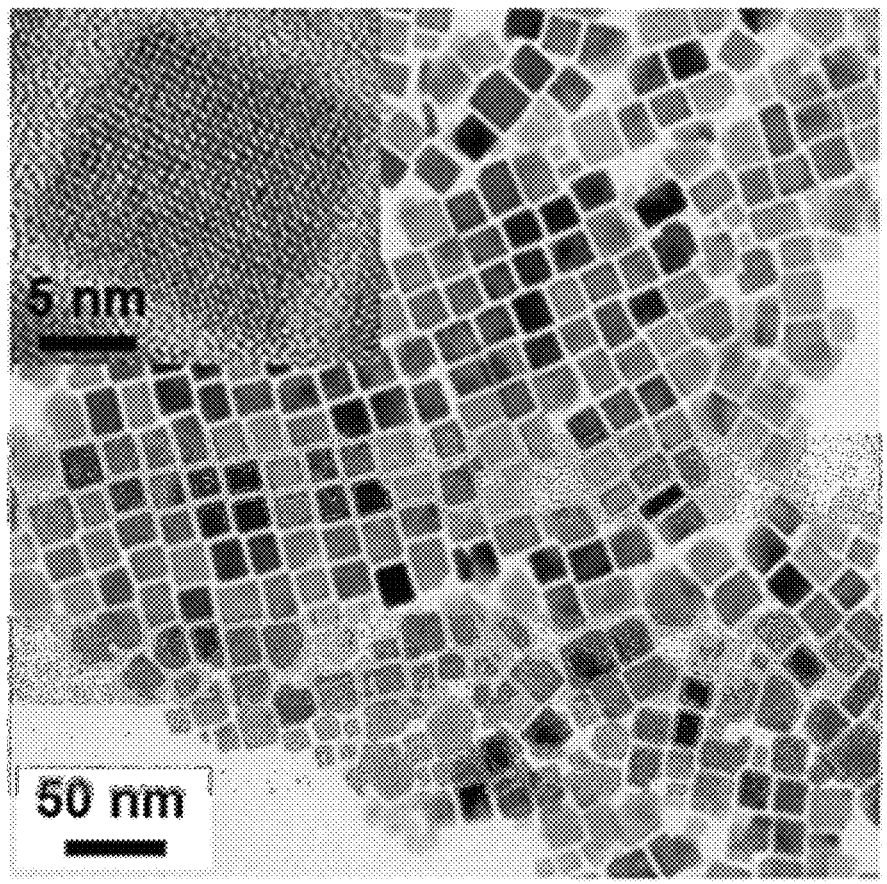
Figure 3:
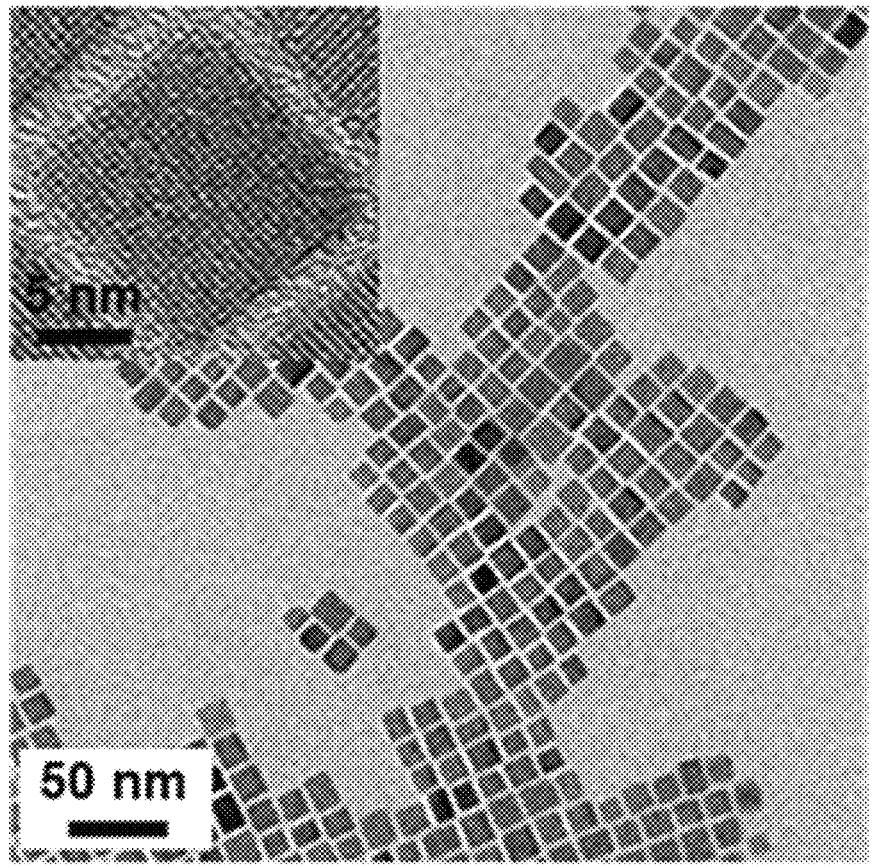

Referring to FIGS. 2 and 3, green quantum dots and red quantum dots were all deposited on a BOLED substrate.

Figure 4:
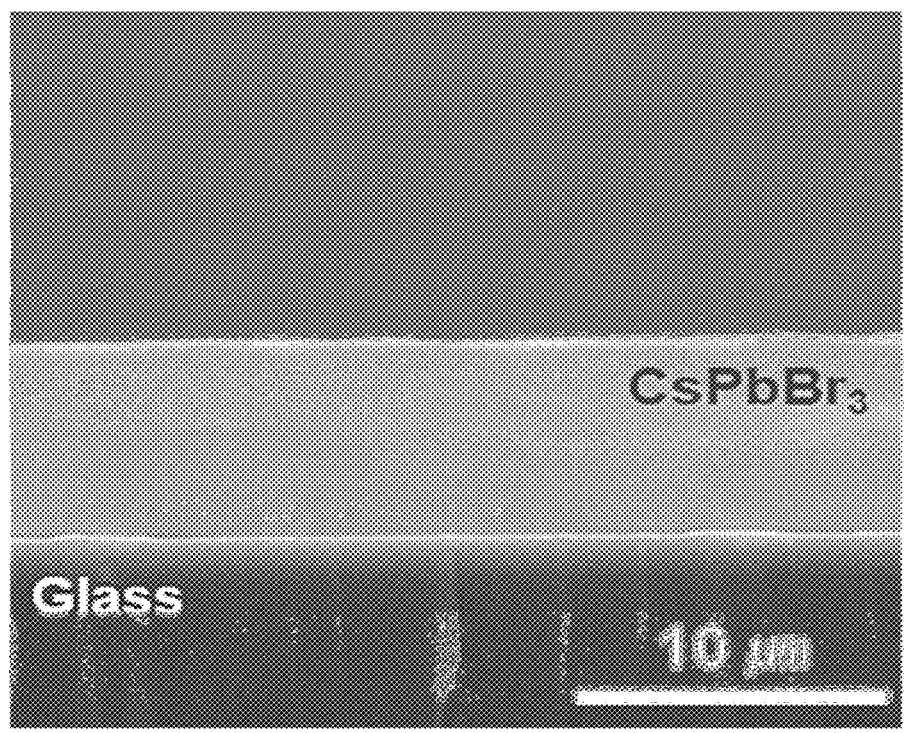
Figure 5:
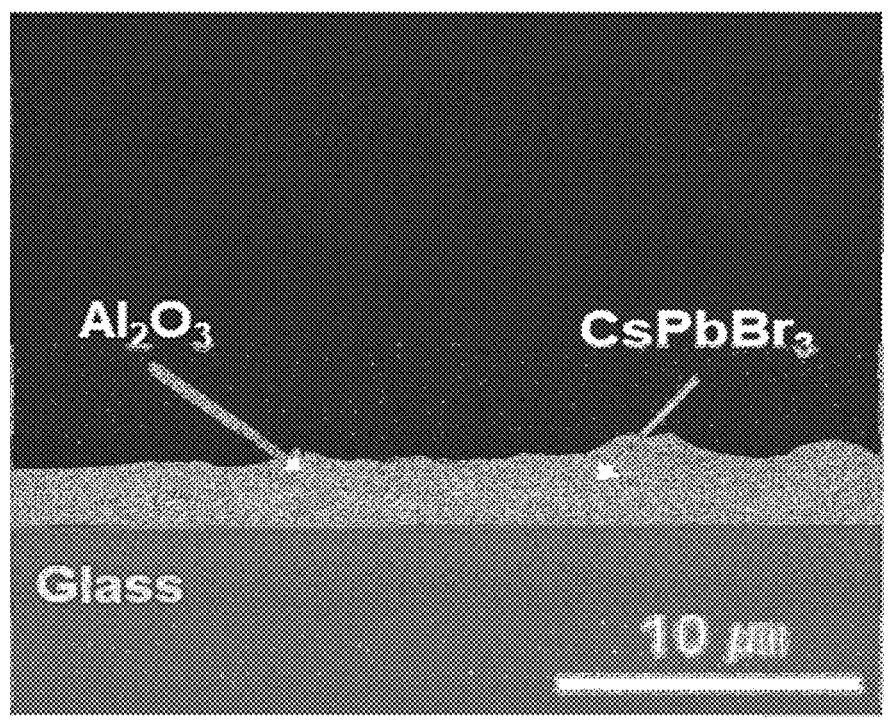
Figure 6:
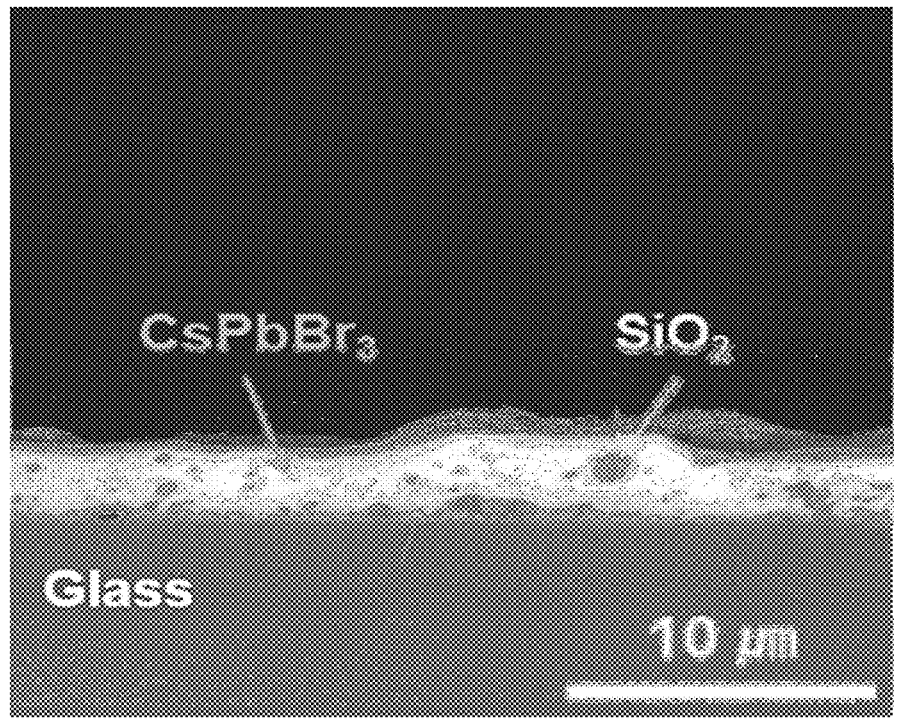

Referring to FIGS. 4 to 6, green quantum dots, alumina-embedded green quantum dots, and silica-embedded green quantum dots were well deposited on a BOLED substrate (glass). FIG. 4 shows a photograph of Comparative Example 1, FIG. 5 shows a photograph of Comparative Example 2, and FIG. 6 shows a photograph of Example 1.

Figure 7:
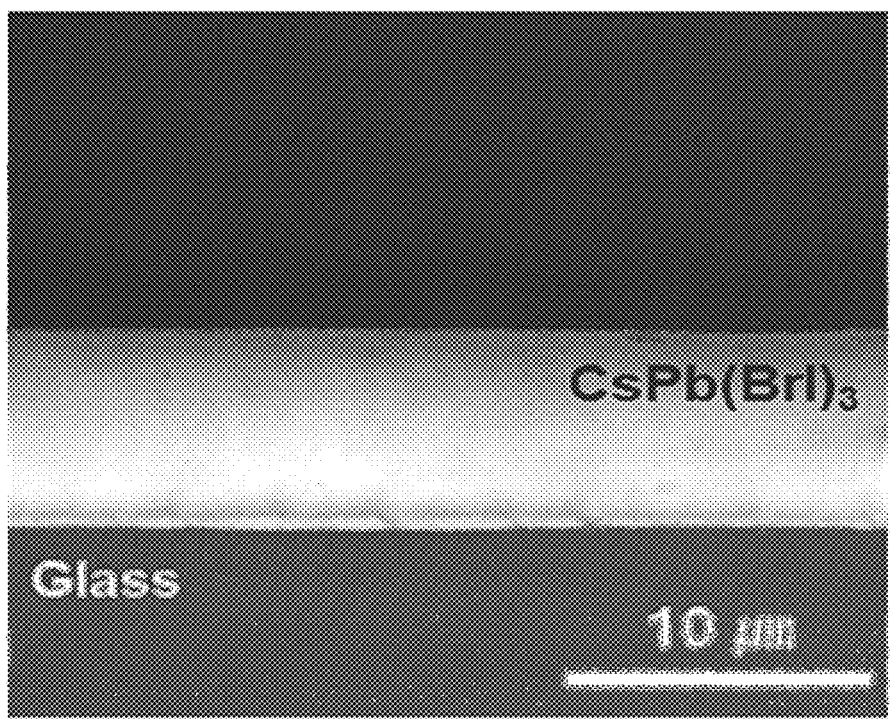
Figure 8:
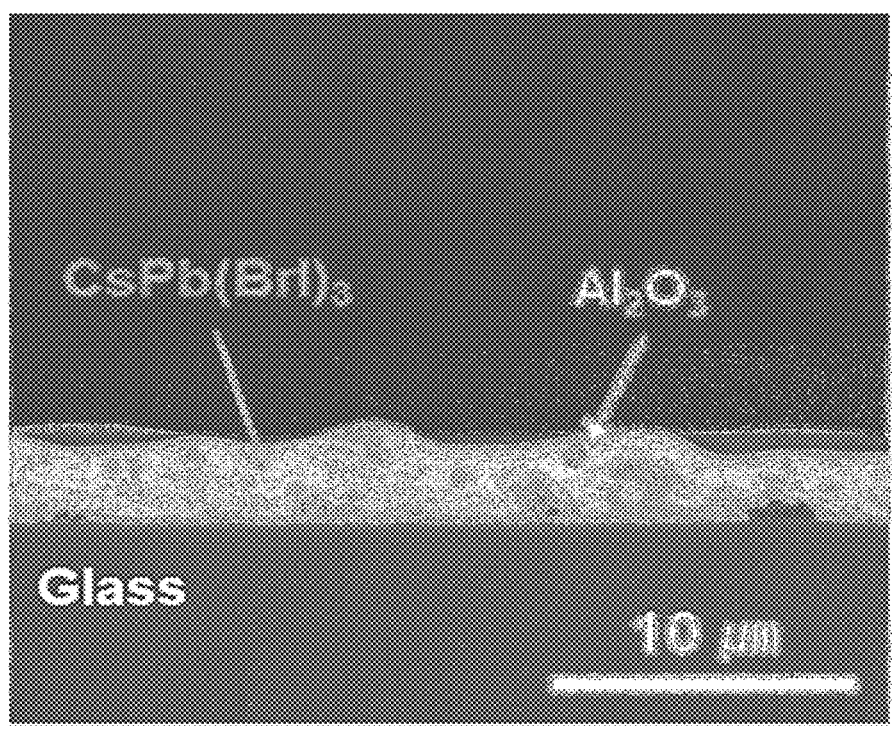

Referring to FIGS. 7 to 9, red quantum dots, alumina-embedded red quantum dots, and silica-embedded red quantum dots were well deposited on a BOLED substrate (glass). FIG. 4 shows a photograph of Comparative Example 1, FIG. 5 shows a photograph of Comparative Example 2, and FIG. 6 shows a photograph of Example 1.

Figure 10:
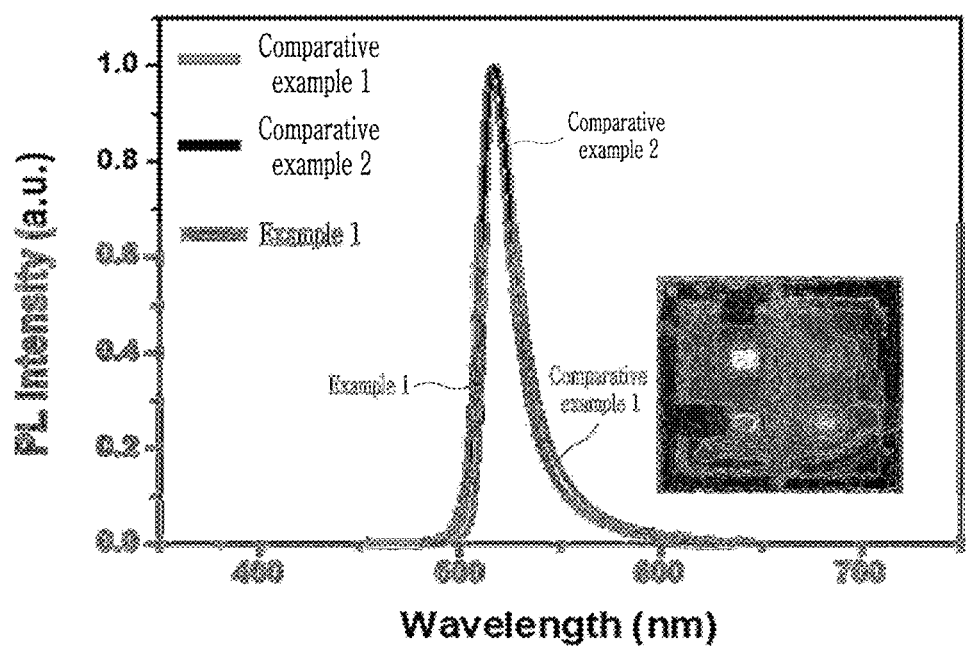
Figure 11:
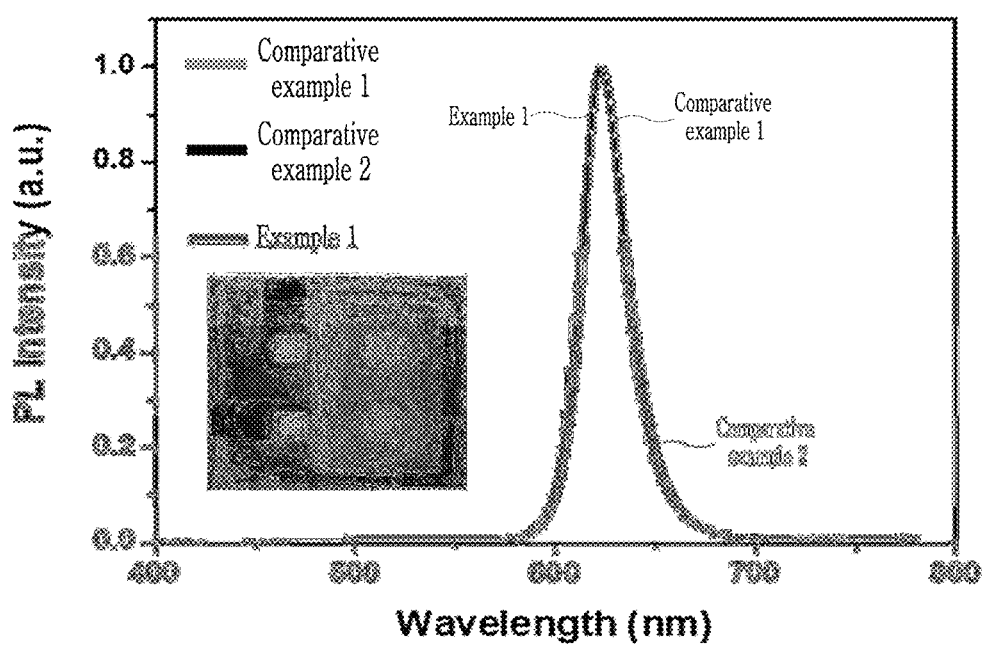

FIG. 10 is a graph showing green photo efficiency of backlight units according to Example 1 and Comparative Examples 1 and 2, and FIG. 11 is a graph showing red photo efficiency of the backlight units according to Example 1 and Comparative Examples 1 and 2. Accordingly, the backlight units according to Example 1 and Comparative Examples 1 and 2 exhibited equivalent photo efficiency, but the backlight unit of Example 1 exhibited excellent wavelength compatibility, compared with the backlight units according to Comparative Examples 1 and 2.

Figure 12:
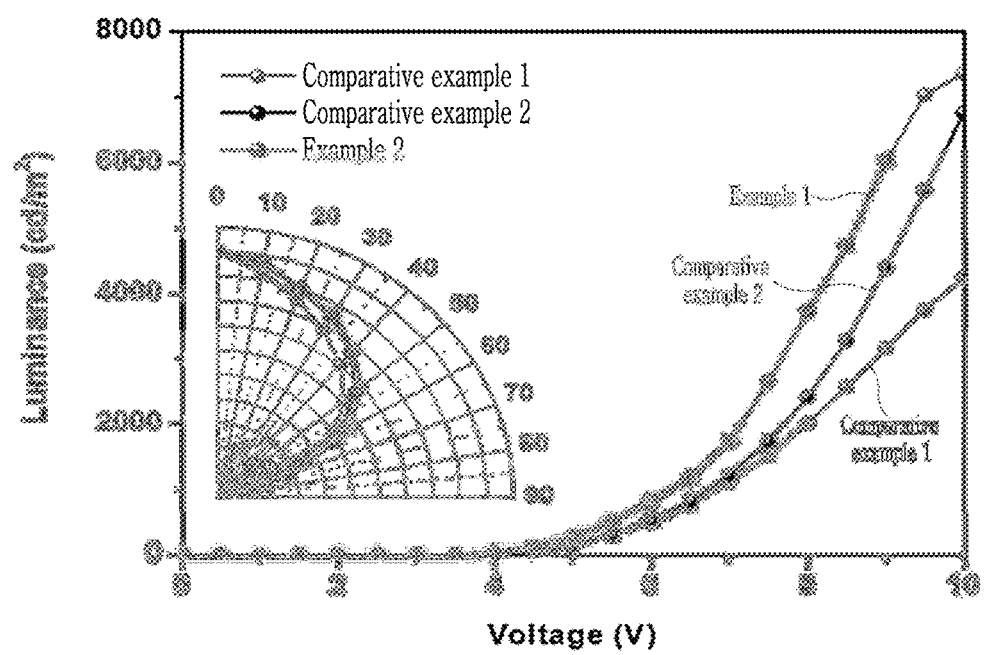
Figure 13:
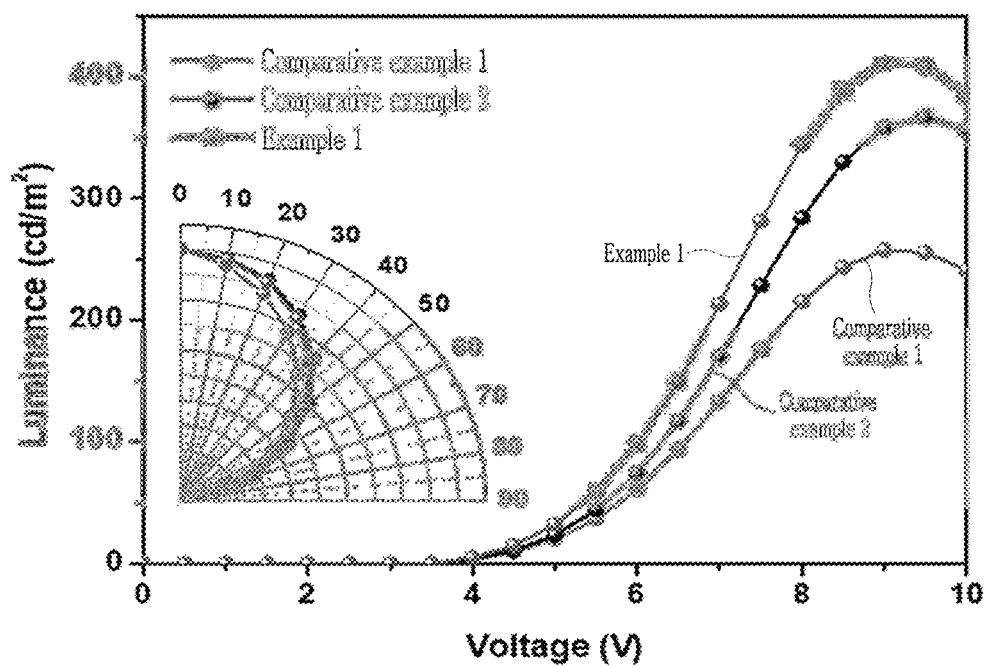

FIG. 12 is a graph showing green luminance of the backlight units according to Example 1 and Comparative Examples 1 and 2, and FIG. 13 is a graph showing red luminance of the backlight units according to Example 1 and Comparative Examples 1 and 2. Accordingly, the backlight unit according to Example 1 had excellent luminance compared with the backlight units according to Comparative Examples 1 and 2.

Figure 14:
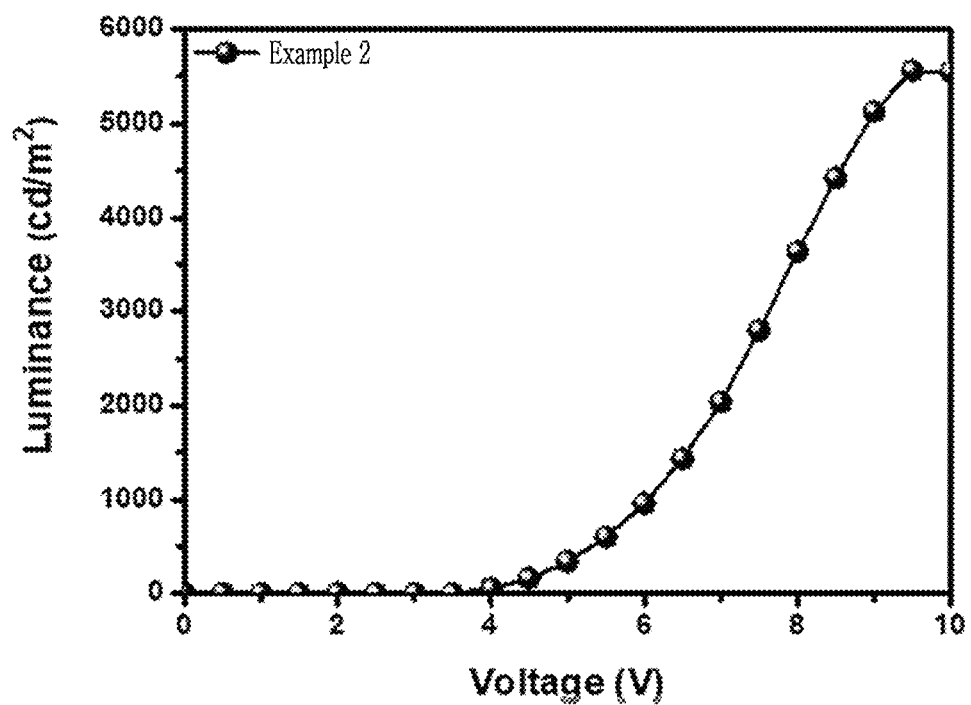
Figure 15:
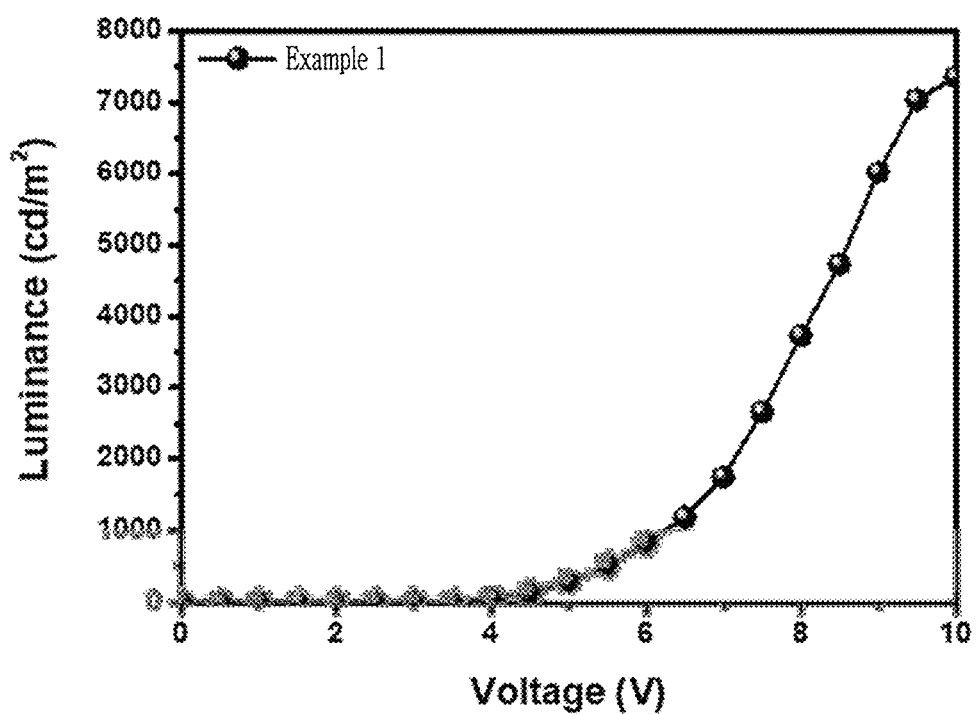
Figure 16:
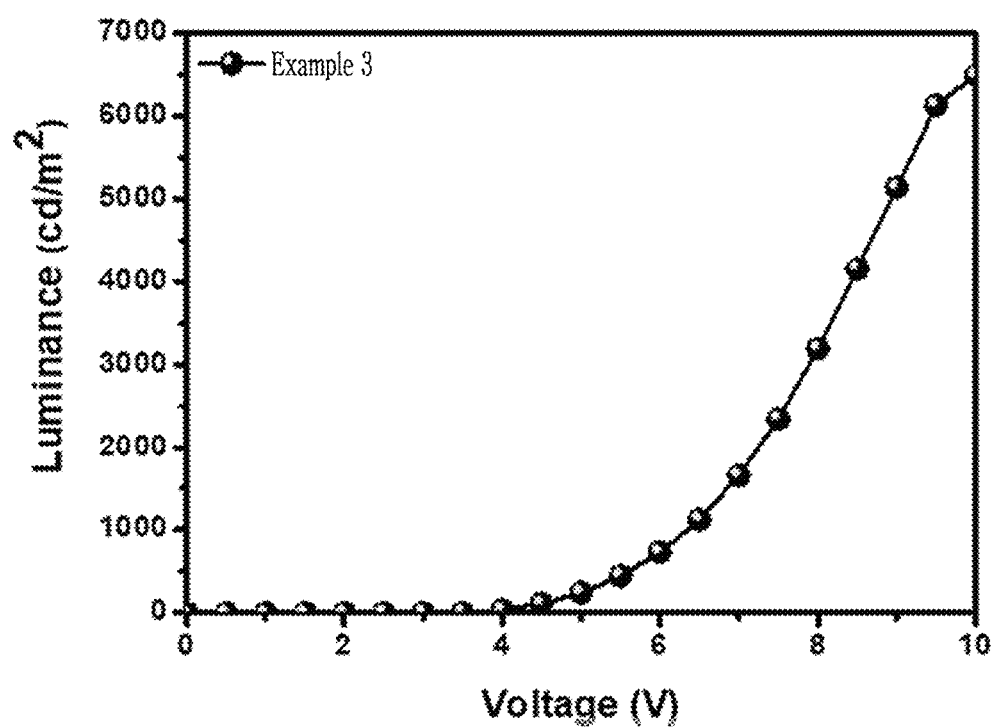

FIG. 14 is a graph showing luminance (green) of the backlight unit according to Example 2, FIG. 15 is a graph showing luminance (green) of the backlight unit according to Example 1, and FIG. 16 is a graph showing luminance (green) of the backlight unit according to Example 3, which shows that the closer an aerosol gas flow rate was to 0.3 L/min, the better luminescence characteristics were and that the aerosol gas flow rate could be controlled to improve luminance of a backlight unit.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A method for depositing perovskite quantum dots, comprising:
    a step of aerosolizing metal halide-based quantum dots having a perovskite crystal structure in which a semimetal element oxide is embedded; and
    a step of coating the aerosolized quantum dots onto a blue OLED substrate,
    wherein the aerosolizing step is carried out under vacuum conditions.

2. A method for depositing perovskite quantum dots, comprising:
    a step of aerosolizing metal halide-based quantum dots having a perovskite crystal structure in which a semimetal element oxide is embedded; and
    a step of coating the aerosolized quantum dots onto a blue OLED substrate,
    wherein an aerosol flow rate during the aerosolizing step is 0.1 L/min to 10 L/min.

* * * * *